(12) United States Patent
Zinner et al.

(10) Patent No.: US 12,025,426 B2
(45) Date of Patent: Jul. 2, 2024

(54) MEASURING DEVICE AND METHOD FOR DETERMINING THE COURSE OF A BONDING WAVE

(71) Applicant: EV Group E. Thallner GmbH, St. Florian am Inn (AT)

(72) Inventors: Dominik Zinner, Zell an der Pram (AT); Jürgen Mallinger, Senftenbach (AT); Thomas Plach, St. Florian am Inn (AT); Boris Povazay, Vienna (AT); Harald Rohringer, Tumeltsham (AT); Jürgen Markus Süss, Rainbach b. Schärding (AT)

(73) Assignee: EV GROUP E. THALLNER GMBH, St. Florian Am Inn (AT)

( * ) Notice: Subject to any disclaimer, the term of this patent is extended or adjusted under 35 U.S.C. 154(b) by 220 days.

(21) Appl. No.: 17/421,267

(22) PCT Filed: Jan. 18, 2019

(86) PCT No.: PCT/EP2019/051244
§ 371 (c)(1),
(2) Date: Jul. 7, 2021

(87) PCT Pub. No.: WO2020/147964
PCT Pub. Date: Jul. 23, 2020

(65) Prior Publication Data
US 2022/0026196 A1    Jan. 27, 2022

(51) Int. Cl.
*G01B 11/14* (2006.01)
*G01B 11/16* (2006.01)
(Continued)

(52) U.S. Cl.
CPC ............... *G01B 11/14* (2013.01); *G01B 11/16* (2013.01); *H01L 21/67288* (2013.01); *H01L 22/12* (2013.01)

(58) Field of Classification Search
CPC ....... H01L 22/10; H01L 22/12; H01L 21/185; H01L 21/187; H01L 21/67242;
(Continued)

(56) References Cited

U.S. PATENT DOCUMENTS 4,899,046 A * 2/1990 Wright .................. G01L 9/0076
250/231.19
6,881,596 B2 * 4/2005 Malville ................ H01L 22/12
438/16
(Continued)

FOREIGN PATENT DOCUMENTS

CN 109065477 A 12/2018
EP 2463892 B1 12/2010
(Continued)

OTHER PUBLICATIONS

Merriam-Webster Dictionary, Definition of "at," accessed on the Internet at https://www.meriam-webster.com/dictionary/at on Dec. 3, 2023, 1 page. (Year: 2023).*
(Continued)

*Primary Examiner* — Gordon J Stock, Jr.
(74) *Attorney, Agent, or Firm* — KUSNER & JAFFE (57) ABSTRACT

A measuring device for determining a course of a bonding wave in a gap between a first substrate and a second substrate, and a method for determining a course of a bonding wave in a gap between a first substrate and a second substrate.

15 Claims, 4 Drawing Sheets

(51) Int. Cl.
*H01L 21/66* (2006.01)
*H01L 21/67* (2006.01)

(58) Field of Classification Search
CPC ......... H01L 21/67259; H01L 21/67288; H01L 21/68; H01L 21/681; H01L 24/01; H01L 24/73; H01L 24/80; G01N 21/9501; G01N 21/9503; G01N 21/9505; G01B 11/02; G01B 11/022; G01B 11/024; G01B 11/028; G01B 11/06; G01B 11/14; G01B 11/16; G01B 11/24; G01B 11/245; G01B 11/26; G01B 11/27; G01B 11/272; G01B 11/30; G01B 11/303; G01B 11/306; B32B 2041/04; B32B 41/00; B32B 37/00; B32B 37/0007; B32B 37/0015; B32B 37/0023; B32B 37/003; B29C 65/002; B29C 65/08; B29C 65/081; B29C 65/14; B29C 65/1403; B29C 65/1406; B29C 65/1409; B29C 65/1412; B29C 65/1416; B29C 65/1419; B29C 65/1422; B29C 65/1425; B29C 65/242; B29C 65/245; B29C 65/64; B29C 65/645; B29C 65/7802; B29C 65/782; B29C 65/7832; B29C 65/82; B29C 65/8253; B29C 65/8261; B29C 65/8292; B29C 66/347; B29C 66/3472; B29C 66/3474; B29C 66/40; B29C 66/41; B29C 66/45; B29C 66/452; B23P 19/02; B23P 19/033; B23P 19/10; G01M 5/0033; G01M 5/0041; G01M 5/005; G01M 5/0066; G01M 5/0091

See application file for complete search history.

(56) References Cited

U.S. PATENT DOCUMENTS

| | | | |
|---|---|---|---|
| 7,479,441 B2 | 1/2009 | Kirk et al. | |
| 7,682,933 B1 * | 3/2010 | Loomis | H01L 25/50 438/455 |
| 8,475,612 B2 | 7/2013 | Gaudin | |
| 9,201,023 B2 | 12/2015 | Mazen et al. | |
| 10,024,741 B2 * | 7/2018 | Povazay | H01L 22/12 |
| 10,037,968 B2 * | 7/2018 | Huang | H01L 21/67092 |
| 10,109,538 B2 * | 10/2018 | Wimplinger | H01L 21/67253 |
| 10,118,246 B2 * | 11/2018 | Hayata | H01L 24/85 |
| 10,279,575 B2 * | 5/2019 | Wagenleitner | B32B 37/003 |
| 10,636,662 B2 * | 4/2020 | Kurz | H01L 25/50 |
| 10,639,875 B2 * | 5/2020 | Kim | H01L 24/80 |
| 11,543,363 B2 * | 1/2023 | Wang | H01L 21/67253 |
| 11,640,912 B2 * | 5/2023 | Kim | H01L 21/68735 438/455 |
| 2012/0077329 A1 | 3/2012 | Broekaart et al. | |
| 2014/0292701 A1 * | 10/2014 | Christiansson | G06F 3/0421 345/173 |
| 2015/0210057 A1 | 7/2015 | Wagenleitner et al. | |
| 2016/0103026 A1 | 4/2016 | Povazay et al. | |
| 2018/0076037 A1 | 3/2018 | Kurz et al. | |
| 2018/0158796 A1 | 6/2018 | Otsuka et al. | |
| 2018/0308077 A1 | 10/2018 | Sugaya et al. | |
| 2018/0308770 A1 * | 10/2018 | Sugaya | H01L 21/68764 |

FOREIGN PATENT DOCUMENTS

| | | | |
|---|---|---|---|
| EP | 2656378 B1 | | 10/2013 |
| EP | 3004827 A1 | | 4/2016 |
| EP | 3382744 A1 | | 10/2018 |
| JP | 2008300394 A | * | 12/2008 |
| JP | 2014146807 A | * | 8/2014 |
| JP | 2016-521849 | | 7/2016 |
| TW | 201502480 A | | 1/2015 |
| WO | WO2014/191033 A1 | | 12/2014 |
| WO | WO2014/194944 A1 | | 12/2014 |

OTHER PUBLICATIONS

Written Opinion and Search Report dated Nov. 25, 2022 from corresponding Singapore Patent Application No. 11201911800X.
Japanese Office Action (with English Translation) in related/corresponding Patent Appl. No. 2021-539930 mailed Jan. 24, 2023.
International Search Report from corresponding International Patent Application No. PCT/EP19/51244, dated Oct. 9, 2019.
Mack, Chris. Fundamental Principles of Optical Lithography: The Science of Microfabrication, John Wiley & Sons, Ltd., pp. 314-323, 2007, Reprint 2012.
https://commons.wikimedia.org/wiki/File%3AOverlay_-_typical_model_terms_DE.svg. (with English machine translation), May 24, 2013.
Office Action issued in corresponding Taiwanese Patent Application No. 109100354 dated Jan. 15, 2024.

* cited by examiner

MEASURING DEVICE AND METHOD FOR DETERMINING THE COURSE OF A BONDING WAVE

FIELD OF INVENTION

The present invention relates to a measuring device and a method according to the coordinated claims.

BACKGROUND OF THE INVENTION

Substrates of different sizes, shapes and materials are routinely connected together in the semiconductor industry. The connecting process is known as bonding. Bonding is split up roughly into permanent and temporary bonding. In the case of permanent bonding, a connection between the two substrates which is no longer detachable arises. This permanent connection takes place by interdiffusion of metals, by cation-anion transport during anodic bonding or by the formation of covalent bonds between oxides and/or semiconductor materials during fusion bonding.

In the case of temporary bonding, use is predominantly made of so-called bonding adhesives. These our adhesives which are applied by a coating on the surface of one or both substrates, in order to act as a bonding agent between the substrates.

In the case of fusion bonding, two substrates are joined together in an initially detachable connection, a pre-bond. This pre-bond arises mainly on the basis of van der Waals bridge bonds between the two ultra-pure, flat surface substrates, which are as fault-free and particle-free as possible, and which are brought into close contact with one another.

Hybrid bonding is a sub-type of fusion bonding. Hybrid bonding represents the connection of two substrate surfaces which are made respectively of an electrical and of a dielectric substrate region. The corresponding correlating substrate regions are connected together by means of a fusion bond (pre-bond). When the pre-bond is transformed into a permanent bond, the permanent electrical contacting between the electrical substrate regions of the substrates arises.

In the case of all bonding methods, use is made of bonders in order to join together the substrates to be bonded with one another. The two substrates to be joined can undergo preliminary treatments, such as surface activation, cleaning steps, alignment steps, until the actual pre-bonding step takes place.

In the pre-bonding step, the substrate surfaces are brought into contact with one another over a very small area. In other words, the jointing reaction is initiated, after which the jointing reaction, i.e. the formation of the bridge bonds, can proceed without the external supply of energy. The jointing process takes place continuously by the propagation of a bonding wave.

The theoretical background is described in U.S. Pat. Nos. 7,479,441B2, 8,475,612B2, 6,881,596B2, and WO 2014/191033.

If the bonding wave has been initiated concentrically in the case of two identical, non-structured substrates, its runs in the ideal case as a concentrically growing circular front along the substrate radius. Structured substrates, impurities, etc. change the course of the bonding wave.

Under non-optimum conditions, unbonded regions (i.e., voids) can arise between the substrates, e.g. due to gas inclusions, particle inclusions etc.

Furthermore, jointing errors can arise as a result of alignment errors (in particular scaling errors due to faulty components, i.e., run-out errors), rotation errors, translation errors, residual errors, temperature compensation errors. Undetected or non-critical errors of the individual substrates or in particular functional units produced in thin-layer technology can accumulate in an error propagation and can only be detected and quantified after the pre-bonding process.

Although the substrates can be aligned very precisely with one another by means of alignment systems, distortions of the substrates can occur during the bonding process itself. As a result of the distortions thus arising, the functional units are not necessarily correctly aligned with one another at all positions. The alignment inaccuracy at a specific point on the substrate may be the result of a distortion, a scaling error, a lens error (magnification or demagnification error) etc.

In the semiconductor industry, all subject areas which deal with such problems are included under the term "overlay". A corresponding introduction to this subject can be found for example in: Mack, Chris. Fundamental Principles of Optical Lithography—The Science of Microfabrication. WILEY, 2007, Reprint 2012.

Each functional unit is designed in the computer before the actual production process. For example, strip conductors, microchips, MEMS, or any other structure that can be produced with the aid of microsystem technology, are designed in a CAD (computer aided design) program. During the production of the functional units, however, it emerges that there is always a deviation between the ideal functional units designed on the computer and the real functional units produced in the clean room. The differences can be traced back primarily to limitations of the hardware, i.e. engineering-related problems, but very often to physical limits.

Thus, the resolution accuracy of a structure, which is produced by a photolithographic process, is limited by the size of the apertures of the photomask and the wavelength of the light used (electromagnetic radiation). Mask distortions are transferred directly into the photoresist and thus into the produced structures. Movement devices such as guides with the drive systems coupled thereto can approach positions reproducible within a predefined tolerance, etc. It is not surprising, therefore, that the functional units of a substrate cannot exactly replicate the structures designed on the computer.

All substrates therefore already have a not inconsiderable deviation from the ideal state even before the bonding process.

If the positions and/or shapes of two mutually opposite functional units of two substrates are compared on the assumption that neither of the two substrates is distorted by a connection process, it is found that, generally speaking, a non-perfect congruence of the functional units is already present, since the latter diverge from the ideal computer model due to the errors described above. The most frequent errors are represented in https://commons.wikimedia.org/wiki/File%3AOverlay_-_typical_model_terms_DE.svg, 24.05.2013 and Mack, Chris. Fundamental Principles of Optical Lithography—The Science of Microfabrication. Chichester: WJLEY, p. 312, 2007, Reprint 2012. According to the illustrations, a rough distinction can be made between global and local or symmetrical and asymmetrical overlay errors. A global overlay error is homogeneous, i.e. independent of the location. It produces the same deviation between two mutually opposite functional units irrespective of the position. The conventional global overall errors are errors I. and II., which arise due to a translation or rotation of the two substrates relative to one another. The translation or rotation of the two substrates produces a corresponding translational or rotational error for all the, in each case mutually opposite, functional units on the substrates. A local overlay error arises depending on the location, chiefly due to elasticity and/or plasticity problems, in the present case primarily caused by the continuously propagating bonding wave. Out of the represented overlay errors, primarily errors III. and IV. are referred to as "run-out" errors. This error arises primarily due to a distortion of at least one substrate during a bonding process. As a result of the distortion of at least one substrate, the functional units of the first substrate are distorted in relation to the functional units of the second substrate. Errors I. and II. can however also arise due to a bonding process, but are usually so markedly overlaid by errors III and IV. that they can only be detected or measured with difficulty.

In the prior art, there already exists a system with the aid of which local distortions can be at least partially reduced. It involves a local distortion due to the use of active control elements (EP2656378B1).

In the prior art, there are already further approaches to a solution to the correction of "run-out" errors. US20120077329A1 describes a method for achieving a desired alignment accuracy between the functional units of two substrates during and after the bonding.

The arising "run-out" errors are in most cases radially symmetrically greater around the contact point, and therefore increase from the contact point to the periphery. In most cases, it involves linearly increasing intensification of the "run-out" error. Under special conditions, the "run-out" errors may also increase non-linearly.

Under particularly good conditions, the "run-out" errors can not only be determined by suitable measuring devices (EP2463892B1), but can also be described, at least approximately, by mathematical functions. Since the overlay errors represent translations and/or rotations and/or scaling between well-defined points, they are preferably described by vector functions. In general, this vector function is a function f:R2->R2, i.e. a mapping rule, which maps the two-dimensional definition range of the position coordinates onto the two-dimensional value range of "run-out" vectors. Although an exact mathematical analysis of the corresponding vector fields has not yet been able to be carried out, assumptions are made with regard to the function properties. The vector functions are with a high degree of probability at least $C^n$ n>=1 functions, i.e. at least constantly capable of being differentiated. Since the "run-out" errors increase from the contacting point to the edge, the divergence of the vector function will probably be different from zero. The vector field is therefore, with a high degree of probability, a source field.

Many faults such as gas inclusions or scaling errors can be traced back primarily to the pre-bonding step, in particular to the course of the bonding wave or the quality and/or design and/or functionality of the respective sample holder (chuck). In the prior art, methods are known which deliver a quantitative statement concerning the course of the bonding wave.

The most frequently used method is the observation of the course of the bonding wave with optical means, in particular camera systems, especially with a transmitted-light method in particular in the infrared spectrum, wherein the substrates must exhibit a transparency sufficient for the observation of the bonding wave. Although this method is standard practice, it has drawbacks. Not all substrates are suitable for transmitted-light methods, in particular metallic coatings prevent the observation of the bond interface which arises during the connection of the two substrate surfaces to be joined. Furthermore, dopings with semiconductor substrates can influence the transmittance of the electromagnetic radiation. Moreover, the transmitted-light method makes particular demands on all sample holders, since they must also be transparent for the radiation, which can also cause problems with the reproducibility of the results.

All the previously known techniques which measure the course of the bonding wave observe the pre-bonding process directly through the substrate or measure the effect of the force of attraction with which the substrates are joined. There is hitherto no direct, commercially available measuring method and no measuring device which can directly observe the course of the bonding wave directly in the bond interface in the case of all substrates irrespective of their material nature.

SUMMARY OF THE INVENTION

The object of the present invention, therefore, is to eliminate the drawbacks of the prior art and in particular to provide a measuring device and a method for the determination of the course and/or in particular the form of a bonding wave, with which the aforementioned drawbacks can at least largely be removed.

This object is solved with the features of the independent claims. Advantageous developments of the invention are given in the sub-claims. All combinations of at least two of the features stated in the description, the claims and/or the drawings also fall within the scope of the invention. In the value ranges, values lying within the stated limits are also intended to be disclosed as limiting values and can be claimed in any combination.

The invention relates to a measuring device for determining a course of a bonding wave in a gap between a first substrate and a second substrate, comprising:
  at least one transmitter, which can be placed at a peripheral edge of the gap, for transmitting signals in the form of electromagnetic waves along a signal path running through the gap,
  at least one receiver, which can be placed at the peripheral edge, for receiving the signals of the first signal path which are sent by the transmitter through the gap and can change before the bonding and/or during the bonding.

The invention relates, in a special embodiment according to the invention, to a measuring device for determining a course of a bonding wave in a gap between a first substrate and a second substrate, comprising:
  at least one transmitter, which can be placed at a peripheral edge of the gap, for transmitting signals in the form of electromagnetic waves along a first signal path running through the gap and at least one further signal path running through the gap,
  at least one receiver, which can be placed at the peripheral edge, for receiving the signals of the first signal path and of the further signal path(s) which are sent by the transmitter through the gap and can change before the bonding and/or during the bonding.

Provision is preferably made such that the measuring device can be used in a bonding device, in particular in-situ.

It is also preferable that the transmitter and/or the receiver can be moved along the peripheral edge.

It is also preferable that the transmitter and/or the receiver is/are rotatable, in particular adjustably rotatable, at the peripheral edge, so that the transmitter and/or the receiver can form with one another an optimum signal path with self-adjusting value maxima.

It is also preferable that the measuring device for determining a course of a bonding wave in a gap between a first substrate and a second substrate comprises
- at least one transmitter, which can be placed at a peripheral edge of the gap, for transmitting signals in the form of electromagnetic waves along a first signal path running through the gap,
- at least one receiver, which can be placed at the peripheral edge, for receiving the signals of the first signal path which are sent by the transmitter through the gap and which can change before bonding and/or during bonding.

It is also preferable that the measuring device comprises a plurality of transmitters distributed at the peripheral edge and/or a plurality of receivers, in particular at least two receivers per transmitter, distributed at the peripheral edge, in each case assigned to a transmitter arranged in particular lying opposite.

It is also preferable that each transmitter sends, in particular simultaneously, a plurality of signal paths and/or each receiver is assigned in each case to a single signal path.

The measuring device is also preferably provided with an evaluation unit for determining measured values along the signal paths, in particular by transformation, preferably by integral transformation, preferably radon transformation, of the signals received by the at least one receiver.

Furthermore, provision is preferably made such that the at least one receiver is constituted so as to detect optical properties of the signal, in particular one or more of the following optical properties:
- refractive index
- mode of signals distinguished as transverse electromagnetic waves
- running time
- intensity
- spectral coding.

A further subject-matter of the invention relates to a bonding device, comprising a measuring device according to one of the preceding embodiments.

Provision is preferably made such that the bonding device comprises influencing means for influencing the bonding wave depending on the course of the bonding wave.

A further subject-matter of the invention relates to a device, comprising a measuring device which, using a method according to the invention, checks the gap, i.e. the distance between substrate surfaces not touching one another, before and/or after bonding. A use of the device can in particular check and/or influence the arrangement of two substrates coated with adhesive prior to the adhesive bonding process.

A further subject-matter relates to a method for determining a course of a bonding wave in a gap between a first substrate and a second substrate, in particular by means of a measuring device according to the preceding embodiments, with the following steps, in particular the following sequence:
- arrangement of at least one transmitter at a peripheral edge of the gap,
- arrangement of at least one receiver at the peripheral edge of the gap,
- transmission of signals in the form of electromagnetic waves by means of the transmitter or transmitters arranged at the peripheral edge along at least a first signal path running through the gap, and optionally further signal paths running through the gap,
- reception of the signals by means of the receiver or receivers arranged at the peripheral edge for the reception of signals of the first signal path and optionally further signal path(s) which are sent by the transmitter(s) through the gap and which can change before bonding and/or during bonding.

A further subject-matter relates to a method for bonding two substrates, wherein the course of the bonding wave is determined by means of a method according to the preceding embodiment.

Provision is preferably made such that the bonding wave is influenced depending on the course of the bonding wave.

The basic idea of the present invention is to transmit electromagnetic waves through the gap between the substrates to be bonded and to measure the change therein after passage between the substrates before and/or during the pre-bonding process, i.e. in the course of the bonding wave, in particular during the change in the position of the bonding wave. A change in the electromagnetic wave is understood to mean a change in the intensity and/or the polarisation and/or the phase etc. According to the invention, the measurement can comprise a multiplicity of signal paths of the electromagnetic waves, i.e. measurement sections, wherein the located bonding wave can be determined from the measurement results from the different, in particular intersecting, signal paths in the gap. Furthermore, triggerable actions, in particular for influencing the bonding wave, can thus be carried out. These triggerable actions are able to be automated, so that the optimum parameters can be determined in particular in real time for each substrate pair to be bonded.

Instead of electromagnetic waves, the present invention could in principle use the change in a particle beam, in particular an ion beam, least preferably in a neutron beam, as a measurement signal.

The invention is based on the further idea of using the changing properties of a gap to determine a course of a bonding wave.

An, in particular independent, or further aspect of the invention is for the bonding wave to be observed directly in the gap, in particular in real time. The quality or transparency of the substrates is not therefore relevant for the observation of the bonding wave.

A further, in particular independent, aspect of the invention is directed towards a bonding device, in particular a fusion bonding device, in which a measuring device according to the invention is integrated. To put it simply, the fusion bonding device uses the measured values of the measuring device according to the invention to influence the course of the bonding wave of the substrates.

The fusion bonding device, the actuating element, the measuring device, the feedback element and the bonding substrate pair, the article, are described as a control loop. At the same time, however, the article, i.e. the substrate pair, wherein the bonding wave passes through and can be influenced, embodies the measurement object, on which a measured variable can be determined.

An, in particular, independent device according to the invention is therefore a fusion bonding device, which actively influences the bonding process in a controlled manner.

A further, in particular independent, device according to the invention is therefore the measuring device with all the transmitters, and receivers, and data processing means and display means, which performs the determination of the course of the bonding wave and stores, transforms, evaluates, relays and displays the measurement results.

A further, in particular independent, aspect according to the invention describes the measurement method for determining the course of the bonding wave, in particular by lateral observation.

A further, in particular independent, method according to the invention describes the controlled bonding process, which influences the course of the bonding wave with the aid of the measurement method according to the invention and controls the fusion bonder.

As a further, in particular independent, aspect according to the invention, the result of the bonding process according to the invention, i.e. the article, is regarded as the bonded substrate stack.

The further idea underlying the invention is to measure spatially resolved, in particular laterally, the bonding wave as a change of one or more optical properties of the gap between the two substrates with at least one transmitter and at least one detector/receiver, or to determine, in particular to calculate, said bonding wave, related to the location, from a cumulative measurement signal by means of mathematical analysis such as the radon transformation, so that a dynamically changing position map of the adhesion results.

In other words, the idea underlying the invention is in particular that the method according to the invention measures the lateral limit of the most convex bonding area, whereby electromagnetic radiation is coupled, in particular parallel to the substrate plane, into the open gap between the substrates and the transmission (in the case of smaller distances, determined primarily by the wave guide properties) between the substrate surfaces and their surface planar transmission through the extended gap is quantified. By means of the lateral observation, it is possible to scan the entire bonding wave at any point in time independently of the transmission of the substrate material. This allows the propagation of the bonding wave to be measured.

In other words, the further idea underlying the invention is that the bonding wave can be controlled or regulated very precisely by means of actuators or static ambient conditions, whereby for example a plurality of vacuum zones arranged behind one another of at least one substrate holder can be deactivated. The substrates are released (at least partially) from the respective substrate holder and contacting of the two substrates is initiated, wherein the propagation can be accelerated or decelerated by influencing the distance between the substrates.

The invention thus comprises the following solution approaches/advantages:
- a direct in situ measurement of the pre-bonding process along the bonding interface of a substrates is enabled, so that the evaluation of the approach of the substrates towards one another and/or of the course of the bonding wave can be carried out before and/or preferably during the fusion bonding process, in particular inside the bonding device,
- it is made possible to determine, in particular directly, the bonding wave in the bonding interface, in particular without introducing a measuring device between the substrates, or requiring transparency of the substrates,
- located, in particular absolute, dynamic position values of the course of the bonding interface can be determined with great precision and over a large temperature range with a high spatial resolution, irrespective of the substrate materials,
- influencing the bonding wave, in particular in real time, in order to be able to bond substrates together as distortion-free as possible or distorted according to the requirements.

The invention permits the in situ measurement of the bonding wave between two substrates. Suitably designed sensors are reusable, can be installed quickly in every kind of fusion bonder, viewed in the long term are less expensive than the sensors and devices according to the prior art, are less labour-intensive and thus permit a rapid and targeted process optimisation. Since the sensors operate in a contactless manner and are arranged outside the substrates, the measurement (both the measurement instruments and also the measurement method itself) does not produce any particles, which would lead to contamination of the bonding interface. In other words, the measurement principle is a non-tactile, particle-free principal.

The transmission along the substrate surfaces (in the gap) uses at least in part the wave guide properties of the material composite. In this case, electromagnetic radiation is thrown back and forth between the substrate surfaces, which has a higher refractive index than the medium in the gap. The transmission through the gap is influenced depending on which complex-valued refractive index (real part: refraction, imaginary part: absorption) the substrate surfaces have. When the substrate surfaces are moved towards one another, i.e. during the pre-bonding process, the number of reflections is inversely proportionally greater and the absorption increases. Consequently, the minimum measurable distance between the substrate surfaces can in principle be greater than 0 nm. As long as the transmission between the emitters and sensors in the gap is guaranteed and the propagation direction along the substrate surfaces is not disturbed, this only means a limitation of the measurement accuracy. The distance at which the transmission discontinues without the substrates being bonded and the gap is thus reduced completely to a height of 0 nm can certainly be determined, but on polished surfaces is usually not of great importance.

The distance at which he transmission discontinues and the jointing of the substrate surfaces begins, i.e. the height of the gap of 0 nm, lie so close to one another from the engineering-related standpoint that the person skilled in the art can readily assume here that, during an approach to preferably less than 10 nm, particularly preferably less than 5 nm, very particularly preferably less than 2 nm distance in the gap with a subsequent signal termination, the substrates at the determined point have not maintained the finite, small distance, but rather are bonded.

In particular, the wavelength of the electromagnetic radiation can be selected, with an adjustable radiation source, such that the maximum transmission is achieved in the gap. In other words, a high spectral absorption can be avoided by the adjustability of the wavelength of the radiation source. The measuring device can thus be small and space-saving, and can be designed energy-efficient. The wavelength of the transmitter, the source, lies in particular in the wavelength range between 0.5 nm to 10,000 nm, preferably between 250 nm to 5000 nm, particularly preferably between 300 nm and 2000 nm, very particularly preferably between 300 nm and 1500 nm. In the optimum case, the radiation source is an in particular monochromatic infrared source.

In contrast with the internal total reflection, which occurs when the wave from the optically denser medium strikes an optically thinner medium, in the case of a wave guide (as the gap between the substrate surfaces to be bonded can be understood in a generalised manner), the reflections are efficient and only at very flat angles. The angle between the Poynting vector of the electromagnetic radiation and the substrate surface is less than 90°, preferably less than 75°, still more preferably less than 30°, most preferably less than 10°, with utmost preference less than 1°.

This angle of the radiation is dependent both on the angle of incidence (of a parallel beam), as well as the divergence angle (widening, or non-parallelism). The latter can also be described by the numerical aperture (abbreviated to NA) of the coupling and is again connected with the focusability (on the small input gap). Distance d≈4·λ/π*(NA*2/n) with λ=wavelength and n=refractive index, in particular in air n=1.

The divergence angle can be understood as the cause of the numerical aperture. It is thus possible to indicate the divergence angle as an angle specification.

The transfer function in the case of dimensions through two parallel surfaces, in particular substrate surfaces, at the distance of the wavelength, leads to refraction and quantisation effects. In the case of distances greater than 500 μm, the transfer function depends very little on the gap width, thereafter it becomes quasi-linearly smaller. In the case of distances less than 10 μm and greater than 3 μm (on the assumption of the use of radiation with a wavelength in the wavelength range between 300 nm and 1500 nm), the transmission is no longer wholly linearly dependent on the distance, because increasingly fewer transverse modes pass into the wavelength guide (i.e. into the narrow gap). The minimal measurable distance between the surfaces is defined by the "cut-off"-distance at $$d < \frac{\lambda}{1{,}7},$$

at which even the last remaining mode is pushed out of the gap.

An optical transfer function describes the change in the properties of the electromagnetic radiation in the gap.

The minimal size of the outer gap can be adjusted by suitably precise focusing (better than 10 micrometres, preferably better than 5 micrometres, particularly preferably better than 2 micrometres) and/or adjustment, and can be positioned at the defined distance before contacting of the wafers. Due to an excessively small gap, the proportion of the coupling losses is higher, so that the measurement method according to the invention is more difficult to carry out.

Refraction losses and "bending of a beam" can become a problem for the beams parallel to the substrate, but grazing the "bonding front". The beam path may be changed and the measurement accuracy is thus limited.

To determine the course of the bonding wave between two substrates, the measuring device as a transmitter and receiver (both should fall under the generic term sensor) is placed into the device, in particular at a small distance, in particular contactless with respect to the outer edge of the in particular lower substrate, at the height of the lower substrate surface to be bonded.

Alternatively, the sensors, i.e. transmitters and receivers, can in particular be placed at a small distance, in particular contactless with respect to the outer edge of the substrate holder, preferably of the lower substrate holder, at the height of the plane of the bonding wave.

Alternatively, the transmitters and/or receivers can be installed in a substrate holder, in particular the lower substrate holder, and suitably functionally integrated. The conditions of spatial accessibility for the handling of the substrates are duly taken into account during the installation of the transmitters and receivers. Friction-locked and/or firmly bonded connections can be present between the transmitter and the receiver and the substrate holder.

The embodiment will be described in greater detail below, wherein transmitters and/or receivers are arranged at the substrate edge. This is done solely to facilitate readability. The alternative arrangements of the transmitters and/or receivers with respect to the substrate holder apply analogously.

Alternatively, the transmitter and the receiver can be arranged in the plane of the bonding wave towards the outer edge of the substrate pair. According to the invention, the position, in particular the height, of the bonded substrate stack, and the position of the bonding interface after the bonding can be determined, measured as the height in particular from the lower substrate holder. With a knowledge of the future bonding interface, a mathematical plane of the not yet started bonding wave can be calculated. In order to be able to use signal paths which are as long as possible, it is advantageous according to the invention to arrange transmitters and receivers at the height of the plane of the bonding wave, towards the outer edge of the substrate pair.

In a first embodiment of the measuring device, the measuring device according to the invention serves as a measurement sensor, the parameters of the bonding wave are merely detected and not used to influence the pre-bonding process. In other words, there is in this embodiment no information-related coupling between the fusion bonder and the measuring device.

The substrates aligned with one another are joined together in the pre-bonding process:

The substrates are aligned with one another with the aid of alignment marks.

At least one substrate is pre-curved.

The substrates are moved towards one another, an in particular continuous gap between the substrates arising, The pre-bonding is introduced with the bond initiation at a contact point.

The measuring device detects the bonding wave arising between the substrates, which changes the optical properties of the gap between the substrates and thus allows an optical property of the substrate surfaces dependent on the propagation of the bonding wave and/or an optical property of the gap dependent on the bonding wave to be determined.

A time-dependent position map is drawn up for the location-dependent determination of the course of the bonding wave. For this purpose, at least one optical and/or electromagnetic signal of a transmitter is coupled at the edge of the non-contacted substrate pair, i.e. sent into the gap. The signal penetrates the gap along a measurement section or a surface segment and is picked up and measured by at least one receiver constituted as a detector at a side facing away from the transmitter, preferably lying precisely opposite. The signal thus sent through the gap has experienced at least one (cumulatively detected) change in at least one of its optical properties along the signal path or a plurality of signal paths when it strikes the bonding wave.

By picking up a plurality of, in particular intersecting, signal paths, the determination of an, in particular dynamically changing, position map is preferably possible.

According to the invention, the following, individually or in combination, are in particular conceivable as properties to be detected by the receiver:

(change in the) intensity,
(change in the) polarisation,
(change in the) double refraction, (change in the) running time,
(change in the) wavelength or frequency, detectable/referred to in visible wavelengths also as a colour change,
(change in the) spectral coding,
(change in the) refractive index,
(change in the) mode of signals distinctive as transverse electromagnetic waves
(change in the) cast shadow Since the signals picked up by the receiver or receivers are the result of the accumulation of all the signal changes along the respective signal path, a mathematical transformation is preferably used to obtain the change in the optical property of the gap as a function of the location. For this purpose, a plurality of measurements are preferably picked up with different transmitter and/or receiver settings along the peripheral edge of the substrate stack or of the measuring device, wherein in particular each signal path intersects with at least one other signal path.

The accumulated output signals are preferably recorded in each case as a function of the angular position of the transmitter and/or of the detector. A preferred mathematical transformation for converting the accumulated signals into the change in the optical signals as a function of the position inside the gap for drawing up a position map is the radon transformation. By using the radon transformation, the change in the optical property at any arbitrary location, in particular at points of intersection of intersecting signal paths, of the detected signal paths of the optical path is obtained as a function of the position of the bonding wave.

Since the change in the optical property(properties) of the gap can be correlated with the position of the bonding wave, the possibility thus arises of picking up the position distribution of the bonding wave between the substrates.

In other words, the method according to the invention preferably proceeds between two substrates in a device for fusion bonding.

The substrates as measurement objects are part of the measurement section for the measurement of the propagation of the bonding wave. Without a substrate pair, the in particular controlled device for bonding according to the invention cannot function. Without substrates as measurement objects, a measurement method according to the invention cannot proceed.

Exemplary embodiments according to the invention are described below, with which the position of the bonding wave can be determined according to the invention.

For all the following exemplary embodiments according to the invention, electromagnetic signals are coupled by a transmitter into the gap between the two substrates at at least one point outside the peripheral edge of a first substrate, said electromagnetic signals running along a signal path or preferably over a surface area, i.e. with a plurality of signal paths. Along the signal paths, at least one of the physical properties changes on account of the position or speed of the bonding wave to be determined.

The detector (receiver) at the outlet of the signal from the gap (i.e. at the end of each signal path) thus receives either a cumulative or at least continuously variable measurement signal along the measurement section. From the mathematical standpoint, the cumulative change in the picked-up properties along each signal path is thus acquired according to the invention by a mapping rule mapped in a measurement signal or as a value.

In order to determine the position course of the bonding wave according to the invention, the transmitter and/or detector/receiver in an exemplary embodiment of the measuring device according to the invention are moved along the outer contour or the peripheral edge of a substrate and a plurality of signals of a plurality of measurement sections are determined and the latter are converted by a mathematical transformation into the local measurement signals. The local measurement signals are then unequivocally dependent on the local position of the bonding wave.

The preferred transformation for the conversion is the radon transformation. The mathematical interrelationships between the determined measurement values of the physical and/or optical properties and the behaviour of the bonding wave are determined in particular empirically.

In a preferred embodiment of the invention, a metallic coating provided functionally for the subassemblies can be used, for purposes other than those intended, on at least one of the substrates as a reflection layer applied additionally at least locally, in order to influence the optical properties of the gap or the measurement values as little as possible by scattering and to deliver a reproducible result. In other words, the metal-coated substrates can be understood as plane, reflecting metal mirrors and not semiconductor mirrors with a lower reflectivity than metal mirrors.

The substrates (which are to be understood both as part of a measuring device and at the same time as substrates to be bonded in a bonding device) can be rectangular, round or shaped in any other way. The substrates preferably have a circular shape. In the case of circular substrates, the diameter of the substrates preferably amounts to 1 inch, 2 inches, 3 inches, 4 inches, 5 inches, 6 inches, 8 inches, 12 inches, 18 inches or more than 18 inches.

Particularly preferably, the substrates are used in the semiconductor industry and the data relate to wafers.

The thickness of the substrates depends on the use. In the majority of cases, the thickness is greater than 10 µm, preferably greater than 100 µm, more preferably greater than 1000 µm, most preferably greater than 2000 µm, with utmost preference greater than 5000 µm. The thicknesses of the two substrates can generally be different.

Since, with the measurement method according to the invention, the joining of two substrates is preferably observed directly in the bonding interface, any materials with high surface quality, irrespective of their transparency, can be joined together. It is irrelevant for the measurement method whether a permanent connection can arise from the joined substrates after the pre-bonding.

A substrate pair joined according to the invention with a temporary fusion bond can be produced in particular for the testing of integrated circuits, for quality control or for other purposes. The random contact or contamination of the functional substrate surfaces can thus be prevented.

Refractive indices of the substrates and surface qualities such as reflectivity are of importance for the method according to the invention. The substrates preferably relay the radiation of the transmitter after multiple reflections in the gap as transmittance to the receiver in the region in the ideal case loss-free, i.e. 100%. Once the radiation strikes the bonding wave, no radiation can pass to the receiver in the gap, so that there is at least locally 0% transmittance. In the original state of the substrates before bonding, when the substrates are brought close to one another before making contact, at least 0.01%, preferably at least 40%, particularly preferably at least 50%, very particularly preferably at least 65%, in the optimum case 99.9%, in the ideal case 100% of the radiation is measured as transmittance.

A measure for the smoothness of the surface can be quantified by the average roughness. The average roughness, in particular the average roughness value, is less than 10000 nm, preferably less than 100 nm, more preferably less than 10 nm, most preferably less than 1 nm, with utmost preference less than 0.1 nm.

With the method according to the invention, substrates comprising metals, (also oxidised or partially oxidised)
semiconductor materials, (also oxidised or partially oxidised)
ceramic materials,
material mixtures or substance mixtures with an amorphous structure,
polymers (elastomers, thermoplastics, etc.)
organic materials (graphite, diamond, graphene, etc.)
structured and/or non-structured substrates, can be joined together in all possible combinations.

The orientation of the crystal lattices has an influence on the refractive index of the respective surface and therefore has a certain importance, which is known to the person skilled in the art.

The relevant parts of the measuring device according to the invention are the transmitters, the gap between the two at least partially reflecting substrate surfaces and the detectors/receivers. The use of the optical properties of a gap of the stack to be bonded permits the unique and wholly novel measurement of the bonding wave during the actual bonding process. The measuring device according to the invention must detect at least one position-dependent optical property required according to the invention.

The evaluation of the measurement signals preferably takes place as follows:

In a first embodiment according to the invention, the optical property of the change in intensity is used to obtain the local, time-resolved position of the bonding wave in the gap. Intensity change is understood to mean the process of attenuation of an incident beam on account of scatter and multiple reflections entailing losses as well as blockages and obstructions in the beam path, i.e. filtering.

The optical gap must therefore have at least an optically effective gap width and/or gap height dependent on the course of the bonding wave, in order to bring about the desired effect of the change in intensity.

The beam running in the gap preferably uses the physical phenomenon of reflection in order to work its way through along the signal path up to the end of the gap. The signal arriving at the detector is therefore an intensity which has changed along the signal path, in particular at least predominantly, by the bonding wave along the measurement section. Further intensity losses result from the multiple reflections or the scattering in the gap. The determination of the local change in the intensity preferably takes place by picking up a plurality of measurement paths, in particular by the movement of the sensor and/or the detector and the use in the radon transformation.

The beam running in the gap experiences an attenuation of the intensity in the interaction with the running bonding wave. The changed intensity, irrespective of whether the losses are brought about by reflection, absorption or scatter, produces a measurement value for the calculation of the course of the bonding wave. The reproducible attenuation of the intensity is required for a successful measurement.

In a preferred embodiment, there is direct "visual contact" between the transmitter and the receiver during the approach up to a limiting value of the height of the gap. In other words, up to a height of the gap, the reflections along the signal path are negligibly small in comparison with the scatter or filtering due to the partial blockage, caused by the bonding wave.

In a further exemplary embodiment according to the invention, the optical property of the running time is used in order to determine the position of the bonding wave in the gap. The running time of the measurement beam in the gap is limited to a minimum in the non-approached state. The refractive index of the substrate surfaces which limit the gap, subsequently referred to as substrate materials, is in particular greater in the non-approached state than the refractive index of the air or the vacuum in the gap (refractive index in air is 1), preferably less than 3.5, with preference less than 3.0, with greater preference less than 2.5, with greatest preference less than 2.0, with utmost preference less than 1.5. The refractive index of the limiting materials due to pretensioning and deformation preferably does not change or only very little. As a result of the different refractive indices between the gap and the limiting materials, the coupled signal is preferably kept predominantly in the gap by the reflection.

An idea according to the invention includes, in particular, the optical material undergoing a plurality of reflections locally due to a local narrowing of the gap and a local change is caused, in particular an increase in the optical path covered, i.e. the change in the running time in the gap.

With the change in the height of the gap, the passage behaviour of the electromagnetic radiation out of the gap into the surroundings i.e. into the limiting materials or the substrates, generally changes. This is understood primarily to mean a local change in the intensity or the running time.

The reflection behaviour and transmission behaviour of the electromagnetic radiation is preferably described with the Fresnel equations. The signal arriving at the detector is therefore an intensity of the electromagnetic radiation which is changed along the signal path, in particular predominantly, preferably exclusively, by the bonding wave along the signal path. The determination of the local intensity or of the local running time preferably takes place by the picking-up of a plurality of measurement sections, in particular by the movement of the transmitter and/or the detector along the peripheral edge and the use of the radon transformation.

According to the invention, it is preferably also possible to correlate the course of the bonding wave through a colour change of the beams due to the change in the optical multiple reflections in the gap. In the case of beams passing through directly, the known spectral composition of the emitted signals is known. Since the limiting substrate surfaces absorb or reflect the spectrum of the radiation differently, it is possible with a smaller gap distance and the accompanying growing number of reflections to measure a change in the spectrum, which is perceived or measured as a colour change.

In a third embodiment according to the invention, transverse electromagnetic waves (TEM wave) are used as an optical property. A TEM wave is understood to mean an electromagnetic wave, the electrical and magnetic field components whereof disappear in the direction of propagation. TEM waves are formed only under the boundary conditions according to the invention. A boundary condition is understood to mean a limiting geometrical condition, which specifies which function values the function in question has, in the special case the electric and/or magnetic field. In particular, standing, transverse electromagnetic waves are formed by boundary conditions according to the invention. The distribution of the electromagnetic field intensity in space is preferably strictly symmetrical. The different embodiments of the standing waves are denoted as modes. The modes of the TEM waves are comparable with the standing waves of acoustics or the standing waves which can be formed with clamped cables.

A further idea according to the invention includes, in particular, coupling a monochromatic electromagnetic wave at a certain angle of incidence into the gap. One of the possible modes is formed by the geometrical boundary conditions. Standing transverse electromagnetic waves thus arise in the gap. If the intensity along the cross-sectional area is analysed in a cross-section of the gap, a symmetrical intensity distribution is obtained. The symmetrical intensity distribution can be represented for simple geometrical boundary conditions, such as those of the extended thin gap, by a mathematical function. This mathematical function contains so-called order parameters, with the aid of which conclusions can be drawn as to the number of maxima.

The idea according to the invention of this embodiment according to the invention thus includes recording the intensity distribution on the receiver side. As a result of the effect of the bonding wave along the measurement section, the geometry is changed in such a way that the gap in particular becomes thinner. The boundary conditions for the TEM wave thus change. The local change in the boundary conditions thus has an influence on the measured intensity signal at the end of the measurement section. In order to obtain a measurement result along the entire substrate surfaces when the substrates approach one another, signals are picked up by a plurality of different detector positions with different transmitter positions. In the specific case, the signals are not integral, but rather area signals. The intensity distribution along a solid angle around the normal of an area detector is thus picked up. The local intensity distribution thus determined in the gap can again be connected to the temporally changing course of the bonding wave and narrowing of the gap thus brought about and thus permits the determination of the entire position course of the bonding wave as a position map.

According to the invention, the number of transmitters can be greater than or equal to one, preferably greater than 5, more preferably greater than 12, most preferably greater than 30. According to the invention, the number of detectors is greater than or equal to one, preferably greater than 3, more preferably greater than 12, most preferably greater than 30. In particular, the transmitter and the receiver/detector are constituted integrally or the transmitter and/or the receiver are arranged, in particular uniformly and/or symmetrically, at the peripheral edge of the substrates to be measured, in particular in the plane of the preferably planar running bonding wave or are moved in rotation with a constant radius about the peripheral edge of the substrates. The transmitters can be constituted as dot, line or preferably large-area radiators. The detectors can be constituted as dot, line or large-area detectors. This measurement process can also be referred to as tomography.

In a further embodiment according to the invention, reflectors are provided outside the outer edge of the substrates. The reflectors are objects, preferably spheres and/or cylinders, the axes whereof lie parallel to the normal of the gap or parallel to the surface normal of the substrates, which have a high reflectivity with the wavelength of the coupled measurement signal. Alternatively, reflectors can be constituted as plane mirrors or as convex or concave mirrors.

The transmitter couples electromagnetic radiation with a predefined frequency into the gap. After a predefined time, the detector measures the response of the system to the coupled signal. Transmitters and detectors can be located in different positions of the periphery of the substrates. Transmitters and detectors are preferably synchronised, so that the detector starts the time measurement as soon as the transmitter couples the signal into the gap. After a certain time, the detector measures a signal, deflected at a reflector. The electromagnetic signal has experienced a change in its intensity as it passed through the gap. The loss of intensity is a measure of the absorption along the signal path, caused by the change in spacing of the gap as an effect of the course of the bonding wave.

The measurement of the change in spacing as an effect of the course of the bonding wave at the position of a reflector takes place through the measurement of the change in the output signal from the input signal. The reduction in intensity is preferably used as a measured variable.

The measurement of the change in distance between the substrates takes place with a distance of more than 0 nm, preferably more than 1 nm, with preference more than 50 nm, with greater preference more than 100 nm, with still greater preference more than 100 micrometres, with utmost preference greater than 150 micrometres, in the optimum case more than 200 micrometres, in the ideal case more than 5000 micrometres.

The accuracy of the time-dependent position values of the bonding wave between the substrates with repeated measurements (known as reproducibility of the measuring device) is better than 20%, preferably better than 15%, with greater preference better than 10%, with greatest preference better than 5%, with utmost preference better than 1%, related to the same pick-up time in each case and/or the same pick-up location in each case.

The measurement can take place at raised temperatures. The measurement takes place at less than 500° C., preferably less than 200° C., more preferably less than 100° C., still more preferably less than 50° C., most preferably at room temperature.

According to the invention, it is in particular possible to cool at least one of the substrates. The substrate is preferably cooled to less than 10° C., particularly preferably less than 0° C., very particularly preferably less than −30° C. It should however be noted that undesired thermal stresses can arise in the resultant bond due to cooling or heating of the substrates. The preferred measurement temperature is therefore the standard normal temperature of 20° C. for the measuring device and also for the substrates.

Inasmuch as the measuring device can be used in a wafer processing device, especially in a wafer bonding device, in particular in a fusion bonder especially in-line, reproducible and graphically representable courses of the bonding waves can be determined. Moreover, it is possible according to the invention to duly manipulate the bonding wave between the substrates on the basis of the bonding wave course (temporal and spatial course), in order to optimise the course of the bonding wave for minimisation of the run-out error.

In order to influence the bonding wave, the following means can be used individually or in combination:
- the distance between the substrates is actively changed by means of controlled positioning devices with active clamping and fixing means.
- the curvature of at least one of the substrates is actively changed by means of variably applied force of a pressure element, in particular a so-called pin.
- the deflection of at least one of the substrates is formed into a shape predefined by a mathematical model by means of locally acting fixing means, in particular locally switched individually controllable vacuum tracks, and/or in particular with piezo-actuators depending on the current position of the bonding wave, whereby individual vacuum points are at least disengaged in a targeted manner, preferably acted upon with excess pressure and/or mechanical force.

the deflection of at least one of the substrates is actively influenced by means of an at least partially locally acting plate, which can be understood to be a stiffening plate. In particular, the stiffening of the plate can, by means of flexible mechanisms such as incompressible fluids in channel systems, be brought and deformed locally into the shape predefined by mathematical models. The stiffening plate can be flattened at least along two axes, independent of one another.

the deflection of at least one of the substrates is actively influenced by means of an at least partially locally acting plate, which can be understood to be a stiffening plate. In particular, the deflection of the stiffening plate with the substrate fixed thereon is actively deformed, with actuating elements such as piezo-linear actuators, by a shape predefined by a mathematical model.

All the stated deformations serve to influence the bonding wave in a closed control loop, in order to eliminate the run-out error at least partially, preferably completely.

In an advantageous preferred embodiment of the invention, the transmitter/transmitters and/or the receiver/receivers can be moved along the peripheral edge. The movement advantageously takes place controlled by the control device, in particular by means of the step motors controlled by the control device.

Alternatively, the synchronised movement of all the transmitters and/or receivers can take place in a controlled manner.

The movement preferably takes place along a path which is congruent in shape with the peripheral edge, in particular an annular path, preferably a circular annular path in particular closed at the periphery.

As a further embodiment according to the invention, a multiplicity of transmitters and/or receivers are arranged fixed, immobile at the edge of the substrate. A rotation of the measurement signal can be produced by the corresponding electronic circuitry and control of the individual transmitters and/or receivers. The results thus detected and calculated can deliver almost identical results compared to the results from measurements with rotated transmitters and receivers.

Advantageously, provision is preferably made according to the invention such that the measuring device comprises a plurality of transmitters distributed at the peripheral edge and/or a plurality of receivers distributed at the peripheral edge and each assigned in particular to a transmitter arranged lying opposite, in particular at least two receivers per transmitter.

By means of the preferred measure according to the invention such that each transmitter transmits a plurality of signal paths, in particular simultaneously, and/or each receiver is assigned in each case to a single signal path, more receivers can be arranged at the peripheral edge than transmitters, so that the detection can take place more efficiently.

Also advantageously, it is preferable according to the invention if the measuring device comprises an evaluation unit for determining located positions of the bonding wave along the signal paths, in particular by transformation, preferably radon transformation, which has signals received from the at least one receiver.

A first method according to the invention for determining the course of the bonding wave during the bending of two substrate surfaces, in particular with lateral observation, comprises in its most generalised form the following steps, in particular in the following sequence:

arrangement of a measuring device at the gap of a first substrate to be bonded and of a second substrate to be bonded at the outer, lateral periphery in particular at the height of the plane of the bonding wave to be measured, transmission of signals in the form of electromagnetic waves by means of the transmitter or transmitters arranged at the peripheral edge along a first signal path running through the gap and at least one further signal path running through the gap, alternatively, the transmission of signals in the form of electromagnetic waves by means of the transmitter or transmitters arranged at the peripheral edge can take place along a first signal path running through the gap, reception of the signals by means of the receiver or receivers arranged at the peripheral edge for the reception of the signals of the first signal path and of the further signal path(s) sent by the transmitter or transmitters through the gap and changeable on account of the course of the bonding wave with a change in the spacing.

A second method according to the invention for influencing the course of the bonding wave during the bonding of two substrate surfaces comprises the observation of the bonding wave, in particular from the side, and control of the actuators for influencing the bonding wave. The method according to the invention comprises in its most general form the following steps, in particular in the following sequence:

arrangement of a measuring device at the gap of a first substrate to be bonded and a second substrate to be bonded at the outer lateral periphery in particular at a height of the plane of the bonding wave to be measured, transmission of signals in the form of electromagnetic waves by means of the transmitter or transmitters arranged at the peripheral edge along a first signal path running through the gap and at least one further signal path running through the gap, initiation of pre-bonding at a contact point of two substrate to be bonded, in particular simultaneous observation and in particular continuous measurement of the gap along a first signal path running through the gap and at least one further signal path running through the gap, processing of the measurement results and feedback of the results as a setpoint value for the actuators, regulated course of the bonding wave using iterations from laterally observed measurement of the bonding wave and change in the control state of the actuators, in particular vacuum, and/or curvature, and/or electrostatic retention force, and/or the distance of the substrates from one another and/or the shape of the substrate holders (freeform surfaces, etc.), storage of the individual measured and correlated parameters of the current pre-bonding, checking of the bonded substrate stack with the aid of a knowledge memory comprising measurement results from previous measurements, in particular automatic decision concerning the jointing quality of the substrate stack.

if quality above a fixed limiting value: release of the substrate stack for further processing, if quality low-grade: return of the substrate stack for reprocessing and/or intervention of the operator.

The aforementioned features described for the measuring device apply correspondingly and reciprocally to a device according to the invention and a method according to the invention.

Further advantages, features and details of the invention emerge from the description of preferred examples of embodiment and with the aid of the drawings.

BRIEF DESCRIPTIONS OF THE DRAWINGS

Identical or identically functioning components are denoted with the same reference numbers in the figures.

DETAILED DESCRIPTION OF THE INVENTION

Figure 1A:
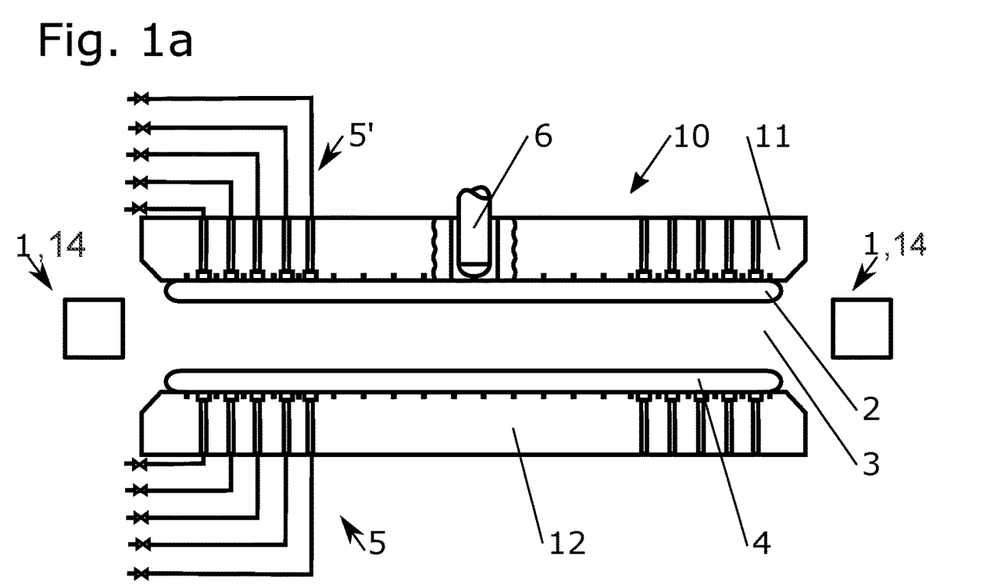
FIG. 1a is a cross-sectional view of a fusion bonding device according to the invention with a measuring device according to the invention.

FIG. 1a shows diagrammatically a bonding device 10, in particular a fusion bonding device, wherein only a first, in particular upper substrate holder 11 and a second, in particular lower substrate holder 12 are represented.

Arranged between substrate holders 11, 12 are a first substrate 2 and a second substrate 4, which are represented with a spacing formed as measurement gap 3.

Substrates 2, 4 are fixed with individually controllable fixing means 5, 5' on respective substrate holder 11, 12.

Individually controllable fixing means 5, 5' mean that the vacuum/pressure channels and/or magnetic and/or electrostatic and/or adhesive fixing means are individually controllable and/or can be controlled in groups. In particular adjacent fixing means can thus apply opposing forces in the direction of action.

Measuring device 1 is arranged in the plane of measuring gap 3 or in the plane of the course of the bonding wave, wherein the individual positioning means and movement means and also the measuring means are not represented. Measuring device 1 can comprise at least one transmitter 7, not represented, and a receiver 8, not represented.

Measurement gap 3 is part of measuring device 1 for measuring optical properties of signals sent through measuring gap 3, wherein measuring device 1 can be installed either as a sensor introduced as a measuring device into the bonding device for the measurements or can be installed fixed in the bonding device.

Both substrates 2, 4 are represented in a non-preloaded condition. Preloading of the substrate can be understood as the effect of a preloading element 6 by the action of force on substrate 2.

Figure 1B:
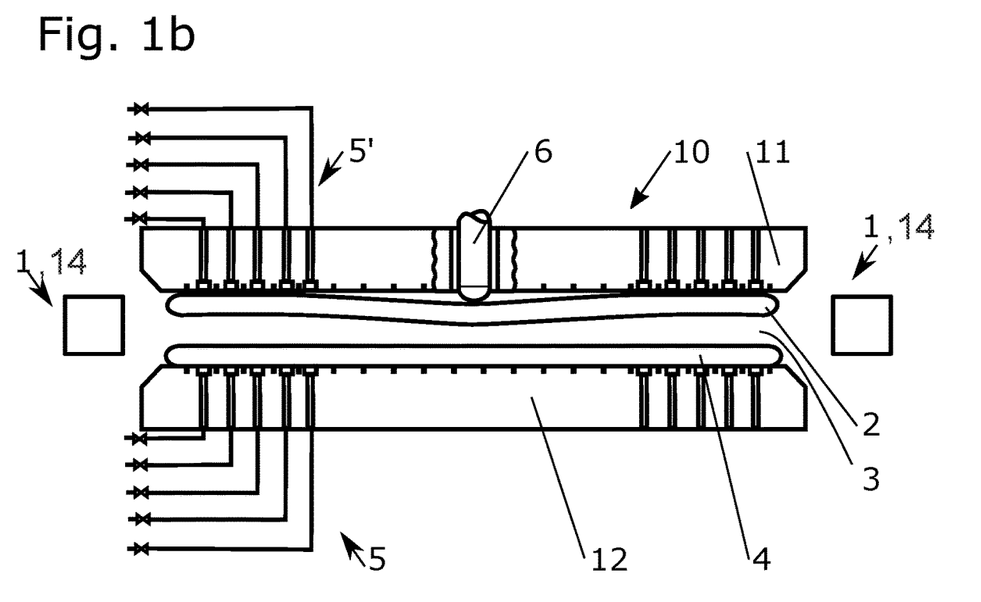
FIG. 1b is a cross-sectional view of a fusion bonding device according to the invention with a measuring device according to the invention as well as a measurement arrangement with a substrate clamped for bonding

FIG. 1b shows diagrammatically bonding device 10 described in FIG. 1a. Measuring device 1 can detect a measurement signal in measurement gap 3 between lower substrate 4 and upper substrate 2, wherein a preloaded element 6, in particular a pin, preloads upper substrate 2 so as to be able to connect substrates 2, 4 with one another.

If the height of the gap is present in measuring device 1 as a measurement or system value, a correlation between the optical property of the measurement signal and the height of the gap is created, so that the measurement results can be outputted and/or stored as a function of the calculated height of the gap in the course of the bonding wave.

Figure 2A:
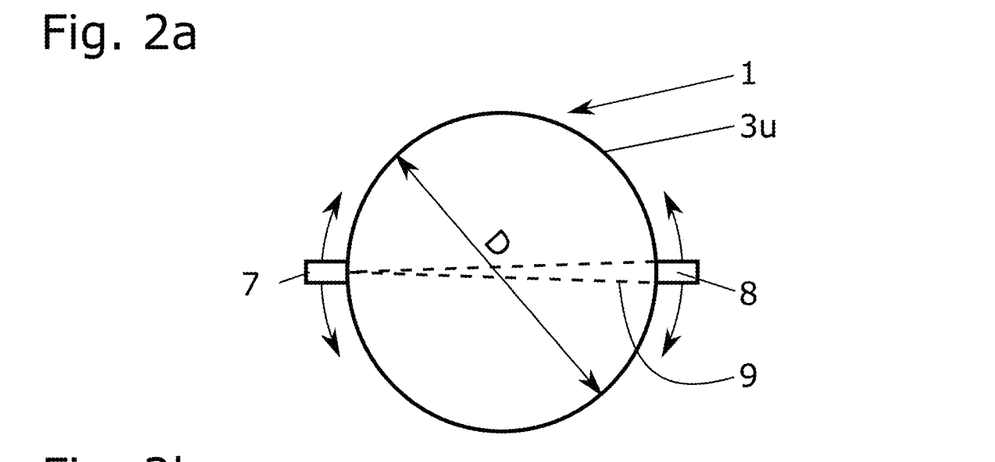
FIG. 2a is a diagrammatic plan view of a first embodiment of a measuring device according to the invention.

FIG. 2a shows diagrammatically a first embodiment of measuring device 1 in a plan view.

For the measurement and transmission of electromagnetic waves, a transmitter 7 is arranged at a peripheral edge 3u of measurement gap 3 according to the embodiment in FIG. 1, which transmitter sends a signal 9 through measurement gap 3 along a signal path.

For the detection according to the invention of entire measurement gap 3, transmitter 7 and/or detector 8 can be moved, in particular synchronised, along peripheral edge 3u, in particular along an annular, preferably circular annular peripheral path, which is represented by arrows. The peripheral path adjoins measurement gap 3 in particular directly.

For the control or regulation of the components according to the invention and the process steps, a control device or regulating device (not represented) is provided.

It is in particular conceivable according to the invention to distribute a plurality of transmitters 7 and/or a plurality of receivers 8 at peripheral edge 3u, which then cover in each case a section of peripheral edge 3u, either by movement or by covering a larger partial section.

Figure 2B:
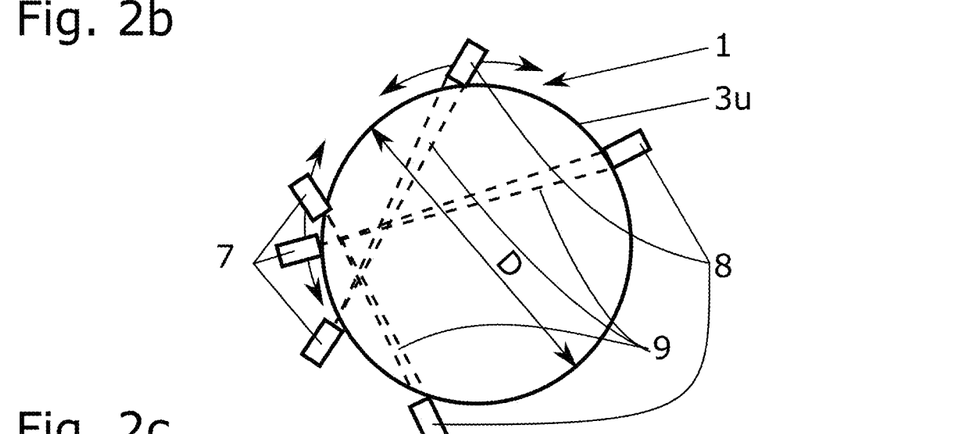
FIG. 2b is a diagrammatic plan view of a second embodiment of a measuring device according to the invention.

FIG. 2b shows diagrammatically a second embodiment of measuring device 1 as an extension of the first embodiment of the measuring device in a plan view. The embodiment is similar to the first embodiment of the measuring device, discussed in FIG. 2a. A plurality of transmitters 7, a plurality of receivers 8 and signals 9 are represented diagrammatically. Signals 9 preferably run as a non-concentric (circular) cord in measurement gap 3, preferably crossing one another from respective transmitter 7 to respective receiver 8.

Figure 2C:
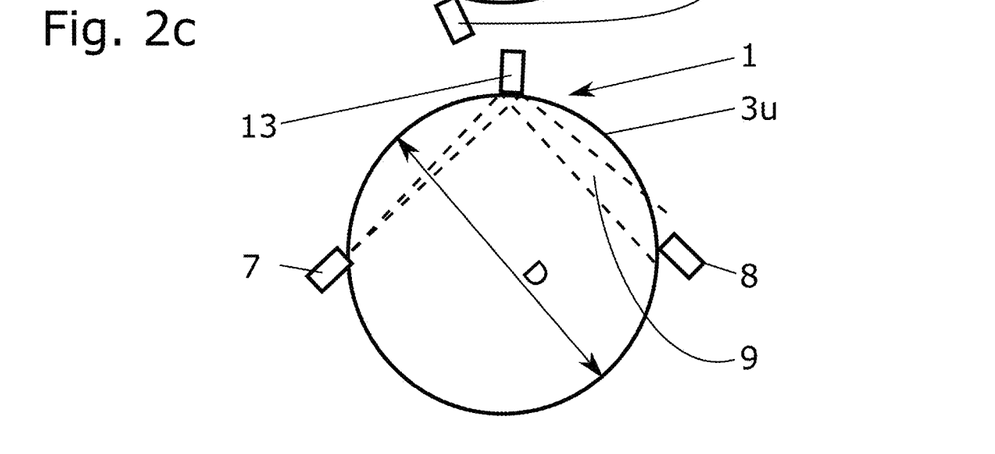
FIG. 2c is a diagrammatic plan view of a third embodiment of a measuring device according to the invention.

FIG. 2c shows diagrammatically a third embodiment of measuring device 1 as a modification of the first and second embodiment of the measuring device in a plan view.

A transmitter 7 constituted by way of example sends a signal 9 to a receiver 8 constituted by way of example in a measurement gap 3. A reflector 13 deflects the signal in measurement gap 3 from transmitter 7 to receiver 8. Transmitter 7, reflector 13 and receiver 8 are in particular arranged at peripheral edge 3u. In alternative embodiments, not represented, peripheral edge 3u relates to the peripheral edge of the holding device, which can fix at least one substrate.

In other embodiments according to the invention, not represented, the beam transmitted by the transmitter is scattered and/or reflected and/or deflected in the gap by the instantaneous, current location of the bonding wave. This changed beam can be detected by at least one receiver and can be used according to the invention to determine the course of the bonding wave.

Figure 3:
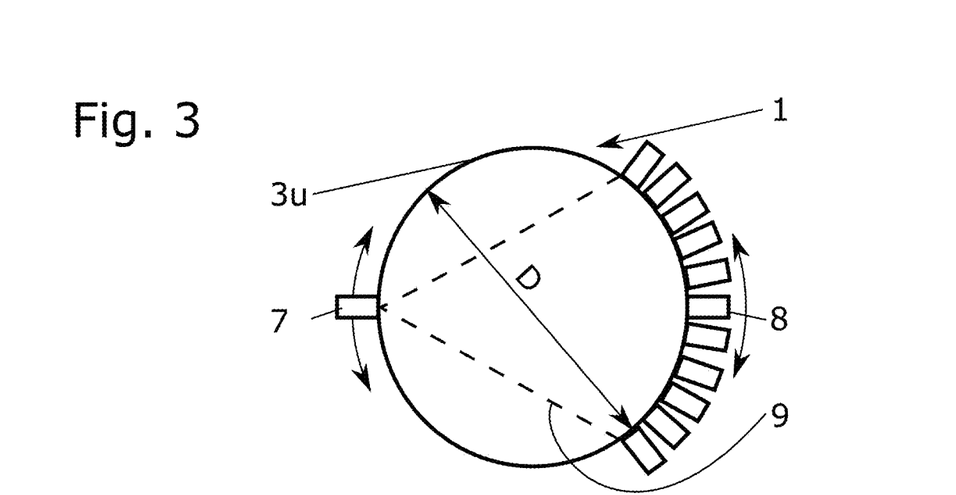
FIG. 3 is a diagrammatic plan view of a fourth embodiment of a measuring device according to the invention.

In the fourth embodiment shown in FIG. 3, a plurality of receivers 8 are thus assigned to a single transmitter 7 lying opposite. Compared to the previously described embodiments according to FIG. 2-c, transmitter 7 transmits signal beam 9, which detects a larger section of measurement gap 3 and comprises a plurality of signal paths, which each lead to one of receivers 8 and are picked up by the latter. The advantage of this embodiment thus lies in the fact that simultaneously a plurality of signals can be detected simultaneously along a larger angular section of measurement gap 3. The required measurement time falls by the factor of the number of receivers 8.

In a further embodiment, signals 9 of transmitter 7 can be emitted timed in a pulsed manner. Receiver 8 can be correspondingly operated in a continuous or in a synchronised timed mode, in particular electronically switched. As a result of this embodiment, electronic switching operations can correspondingly replace a movement of measuring device 1 at peripheral edge 3u.

Entire measurement gap 3 can be detected by moving transmitter 7 and receiver 8 assigned to transmitter 7 along peripheral edge 3u. Alternatively, a plurality of transmitters 7 distributed at the periphery and respectively assigned receivers 8 can be arranged so that entire measurement gap 3 can be detected without moving the transmitter and receivers 8.

Figure 4:
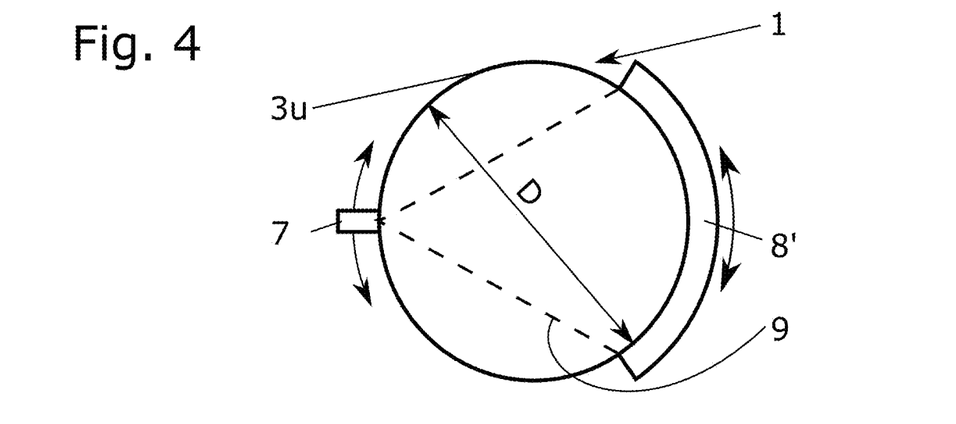
FIG. 4 is a diagrammatic plan view of a fifth embodiment of a measuring device according to the invention.

FIG. 4 shows a fifth embodiment for the detection of measurement gap 3, wherein a transmitter 7 and a receiver 8' are provided, wherein receiver 8' is provided as a line or area detector, in particular as a CCD-detector, preferably as a CMOS-detector. The linear surface detector is capable of picking up signals along a line or area and further processing the latter immediately. Depending on the spatial resolution of receiver 8', the latter is constituted detecting a multiplicity of signal paths of signal 9. Analogous to the embodiment according to FIG. 3, both transmitter 7 and receiver 8' can move along peripheral edge 3u or a multiplicity, in particular three, of transmitters 7 are distributed at the periphery with in each case receiver 8' lying opposite.

The previously described embodiments have in common the fact that virtually any number of measurement paths running through measurement gap 3 can be detected by correspondingly small movement steps of transmitter 7 and receivers 8, 8'. The movement can take place in particular by means of step motors, which are controlled by the control device. Controls or control devices are correspondingly coordinated. It is in particular conceivable according to the invention to use correspondingly synchronised, in particular brushless d.c. motors with a large downstream transmission ratio for a fine positioning capability of transmitter 7 and of receivers 8, 8'.

The detected data are evaluated by an evaluation unit 14, A possible evaluation is the local, in particular time-dependent position of the bonding wave evaluated by the evaluation unit 14, plotted at given positions. It can be seen that the course of the bonding wave changes as a function of the location and the point in time.

Figure 5A:
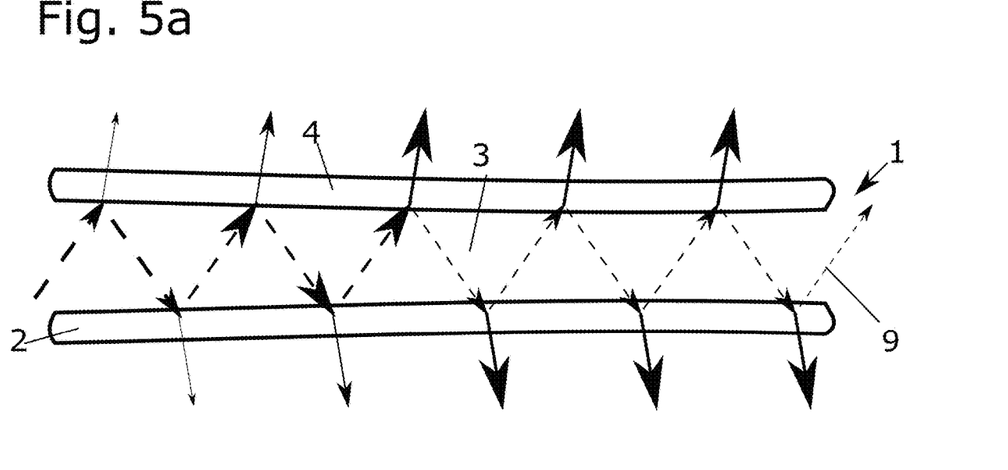
FIG. 5a is a diagrammatic representation of a measurement of an optical property of a preferred embodiment of the device according to the invention.

FIG. 5a shows the determination of a further optical property of the optical material of measurement gap 3, i.e. the intensity loss. With a reduced distance between the substrates, the signal in measurement gap 3 is reflected with an increased number of reflections for the same distance, and the optical intensity loss increases with a reduced distance. As a result of the change in the distance, the reflection property of signal 9 changes and therefore its intensity. The propagation of signal 9 is represented by the propagation direction of the electromagnetic wave of signal 9 according to the rules of geometrical optics. The different thickness of the arrows represents diagrammatically the intensity, which is high at the entrance of signal 9 into measurement gap 3.

As a result of the change in the distance with the progressing path, increasingly more photons of the electromagnetic wave are scattered, blocked, reflected or absorbed from measurement gap 3, which is represented by increasingly thinner arrows. The arrow of the photons leaving measurement gap 3 is thicker with a diminishing distance. Evanescent waves can arise as losses.

In FIG. 5a, it should be noted that signal 9 is introduced into gap 3 not in parallel or not substantially in parallel.

Figure 5B:
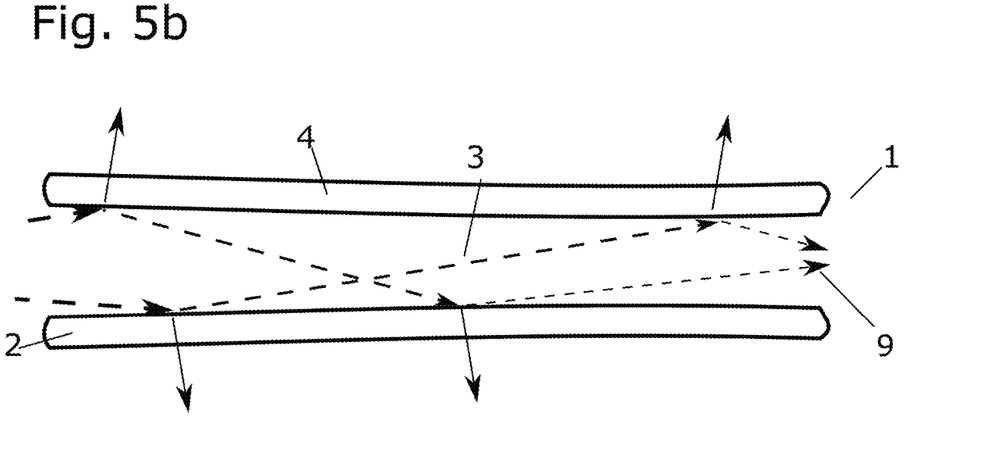
FIG. 5b is a diagrammatic representation of a measurement of an optical property of a preferred embodiment of the device according to the invention.

FIG. 5b shows the determination of a further optical property of the optical material of measurement gap 3 with a slightly divergent signal 9 coupled in parallel, wherein only two edge beams are represented diagrammatically. The divergence angle of the transmitter, indicated by the entry arrow of signal 9, is less than 10 degrees, preferably less than 5 degrees, particularly preferably less than 3 degrees, very particularly preferably less than 1 degree.

In FIG. 5b, the radiation is coupled into the gap preferably parallel to the substrate surfaces.

For the embodiment represented in FIG. 5b, the features described in FIG. 5a continue to apply.

Figure 6:
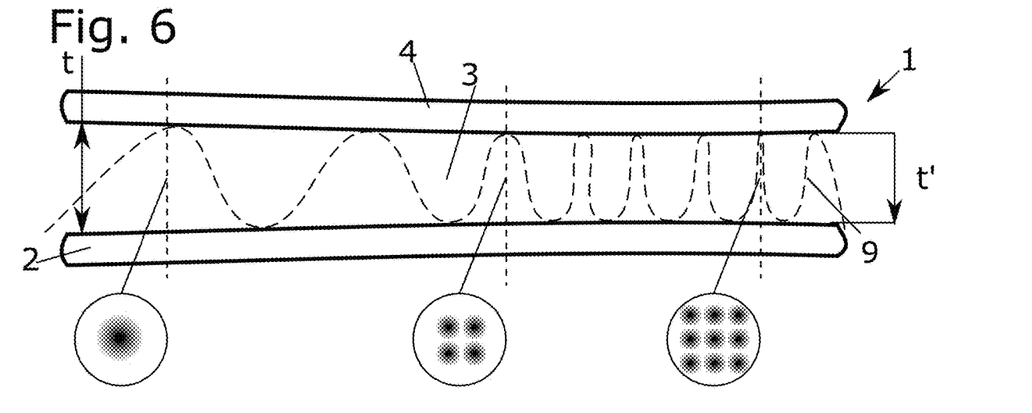
FIG. 6 is a diagrammatic representation of a measurement of an optical property of a particularly preferred embodiment of the device according to the invention.

FIG. 6 is a diagrammatic representation of the change in a TEM wave, due to a change in distance along a path L. Measurement gap 3 changes along path L from t to t', as a result of which the standing electromagnetic wave inside measurement gap 3 also changes. This change in the electromagnetic wave leads to a change in the mode of the electromagnetic wave and also in the intensity distribution. From the change in the mode and/or intensity distribution, a location-related determination of the bonding wave can be made, wherein a multiplicity of signal paths is evaluated. By measuring the intensity distribution of the modes along peripheral edge 3u, conclusions can be drawn, by means of the transformation, preferably a radon transformation, as to the intensity distribution of the mode at a specific location of measurement gap 3. The local position of the bonding wave or disturbances can be determined from this.

LIST OF REFERENCE NUMBERS

1 Measuring device
2 first substrate
3 Measurement gap, gap
3u Peripheral edge
4 second substrate
5, 5' Individually controllable substrate fixing means
6 Preloading means, in particular pin
7 Transmitter
8, 8' Receiver
9 Signal
10 Fusion bonding device
11 first substrate holder
12 second substrate holder
13 Reflector
14 Evaluation unit
D Diameter
t, t' Gap thickness

What is claimed is:

1. A measuring device for determining a course of a bonding wave in a gap between a first substrate and a second substrate, said measuring device comprising:
    at least one transmitter located at a peripheral edge of the gap for transmitting signals in the form of electromagnetic waves along a signal path running through the gap; and
    at least one receiver, located at the peripheral edge of the gap for receiving the signals of the signal path which are sent by the at least one transmitter through the gap and which can change before bonding of the first and second substrates and/or during bonding of the first and second substrates, wherein electromagnetic radiation is transmitted as the signals by the at least one transmitter into the gap parallel to at least one of a substrate surface of the first substrate and a substrate surface of the second substrate to be bonded, and wherein transmissions along the at least one of the substrate surface of the first substrate and the substrate surface of the second substrate to be bonded and transmission at the gap are measured by the at least one receiver to measure lateral limits of the substrate surfaces to be bonded.

2. The measuring device according to claim 1, wherein the at least one transmitter and/or the at least one receiver is movable along the peripheral edge.

3. The measuring device according to claim 1, wherein each said transmitter transmits a plurality of signal paths and/or each said receiver is assigned to a single signal path.

4. The measuring device according to claim 3, wherein each said transmitter transmits the plurality of signal paths simultaneously.

5. The measuring device according to claim 1, wherein the at least one receiver detects one or more optical properties of the signals.

6. The measuring device according to claim 5, wherein the one or more optical properties are selected from the group including:
    double refraction,
    refractive index,
    mode of signals distinctive as transverse electromagnetic waves,
    running time, and
    spectral coding.

7. The measuring device according to claim 1, wherein said measuring device comprises a plurality of said transmitters distributed at the peripheral edge of the gap and/or a plurality of said receivers distributed at the peripheral edge of the gap.

8. The measuring device according to claim 7, wherein said measuring device comprises at least two of said receivers for each of said transmitters.

9. The measuring device according to claim 7, wherein each of said receivers is assigned to a respective transmitter lying opposite said receiver.

10. The measuring device according to claim 1, wherein the measuring device includes an evaluation unit for determining measured values along the signal paths of the signals received by the at least one receiver.

11. The measuring device according to claim 10, wherein the evaluation unit determines the measured values along the signal paths by transformation.

12. The measuring device according to claim 11, wherein the transformation is a radon transformation.

13. A bonding device, comprising:
    a measuring device for determining a course of a bonding wave in a gap between a first substrate and a second substrate, said measuring device comprising:
        at least one transmitter located at a peripheral edge of the gap for transmitting signals in the form of electromagnetic waves along a signal path running through the gap; and
        at least one receiver, located at the peripheral edge of the gap for receiving the signals of the signal path which are sent by the at least one transmitter through the gap and which can change before bonding of the first and second substrates and/or during bonding of the first and second substrates; and
    influencing means for influencing the bonding wave depending on the course of the bonding wave,
    wherein electromagnetic radiation is transmitted as the signals by the at least one transmitter into the gap parallel to at least one of a substrate surface of the first substrate and a substrate surface of the second substrate to be bonded, and
    wherein transmissions along the at least one of the substrate surface of the first substrate and the substrate surface of the second substrate to be bonded and transmission at the gap are measured by the at least one receiver to measure lateral limits of the substrate surfaces to be bonded.

14. A method for determining a course of a bonding wave in a gap between a first substrate and a second substrate by means of a measuring device including at least one transmitter and at least one receiver, said method comprising:
    arranging the at least one transmitter at a peripheral edge of the gap,
    arranging the at least one receiver at the peripheral edge of the gap,
    transmitting signals in the form of electromagnetic waves by means of the at least one transmitter arranged at the peripheral edge along a first signal path running through the gap,
    receiving the signals by means of the at least one receiver arranged at the peripheral edge for the reception of the signals of the signal path which are sent by the at least one transmitter through the gap and which can change before bonding of the first and second substrates and/or during bonding of the first and second substrates,
    wherein electromagnetic radiation is transmitted as the signals by the at least one transmitter into the gap parallel to at least one of a substrate surface of the first substrate and a substrate surface of the second substrate to be bonded, and
    wherein transmissions along the at least one of the substrate surface of the first substrate and the substrate surface of the second substrate to be bonded and transmission at the gap are measured by the at least one receiver to measure lateral limits of the substrate surfaces to be bonded.

15. A method for bonding two substrates, comprising:
    determining a course of a bonding wave in a gap between a first substrate and a second substrate by means of a measuring device including at least one transmitter and at least one receiver, the determining comprising:
        arranging the at least one transmitter at a peripheral edge of the gap;
        arranging the at least one receiver at the peripheral edge of the gap;
        transmitting signals in the form of electromagnetic waves by means of the at least one transmitter arranged at the peripheral edge along a first signal path running through the gap; and
        receiving the signals by means of the at least one receiver arranged at the peripheral edge for the reception of the signals of the signal path which are sent by the at least one transmitter through the gap and which can change before bonding of the first and second substrates and/or during bonding of the first and second substrates,
    wherein the bonding wave is influenced depending on the course of the bonding wave, wherein electromagnetic radiation is transmitted as the signals by the at least one transmitter into the gap parallel to at least one of a substrate surface of the first substrate and a substrate surface of the second substrate to be bonded, and wherein transmissions along the at least one of the substrate surface of the first substrate and the substrate surface of the second substrate to be bonded and transmission at the gap are measured by the at least one receiver to measure lateral limits of the substrate surfaces to be bonded.

* * * * *